US008569822B2

(12) United States Patent
Huang et al.

(10) Patent No.: US 8,569,822 B2
(45) Date of Patent: Oct. 29, 2013

(54) MEMORY STRUCTURE

(75) Inventors: Jyun-Siang Huang, Hsinchu (TW); Wen-Jer Tsai, Hsinchu (TW); Shih-Guei Yan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/287,728

(22) Filed: Nov. 2, 2011

(65) Prior Publication Data

US 2013/0105882 A1 May 2, 2013

(51) Int. Cl.
*H01L 29/76* (2006.01)
*H01L 29/792* (2006.01)

(52) U.S. Cl.
USPC .... 257/314; 257/324; 257/326; 257/E27.078; 257/E29.3; 257/E21.21

(58) Field of Classification Search
None
See application file for complete search history.

(56) References Cited

U.S. PATENT DOCUMENTS

| | | | |
|---|---|---|---|
| 6,995,053 B2 * | 2/2006 | Schuele et al. | 438/192 |
| 7,221,018 B2 * | 5/2007 | Forbes | 257/324 |
| 7,235,437 B2 * | 6/2007 | Schuele et al. | 438/154 |
| 2005/0104091 A1 * | 5/2005 | Tabery et al. | 257/213 |
| 2008/0224205 A1 * | 9/2008 | Joshi et al. | 257/329 |
| 2010/0244117 A1 * | 9/2010 | Prall et al. | 257/316 |
| 2011/0079840 A1 * | 4/2011 | Huang et al. | 257/325 |
| 2011/0156025 A1 * | 6/2011 | Shionoiri et al. | 257/43 |

OTHER PUBLICATIONS

Quirk, Michael Semiconductor Manufacturing Technology, p. 507-508, Copyright 2001 by Prentice-Hall, Inc., ISBN 0-13-081520-9.*

* cited by examiner

*Primary Examiner* — Shouxiang Hu
*Assistant Examiner* — Harpreet Singh
(74) *Attorney, Agent, or Firm* — J.C. Patents

(57) ABSTRACT

A memory structure having a memory cell including a first dielectric layer, a gate, a semiconductor layer, a first doped region, a second doped region and a charge storage layer is provided. The first dielectric layer is on the substrate. The gate includes a base portion on the first dielectric layer and a protruding portion disposed on the base portion and partially exposing the base portion. The semiconductor layer is conformally disposed on the gate, and includes a top portion over the protruding portion, a bottom portion over the base portion exposed by the protruding portion and a side portion located at a sidewall of the protruding portion and connecting the top and bottom portions. The first and second doped regions are respectively in the top and bottom portions. The side portion serves as a channel region. The charge storage layer is between the gate and the semiconductor layer.

10 Claims, 3 Drawing Sheets

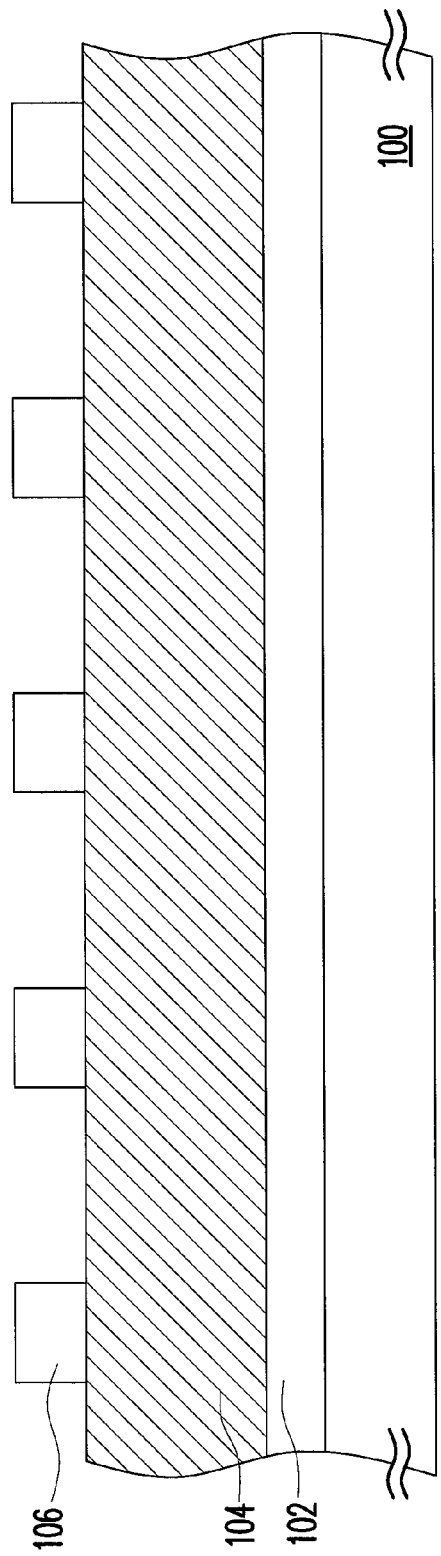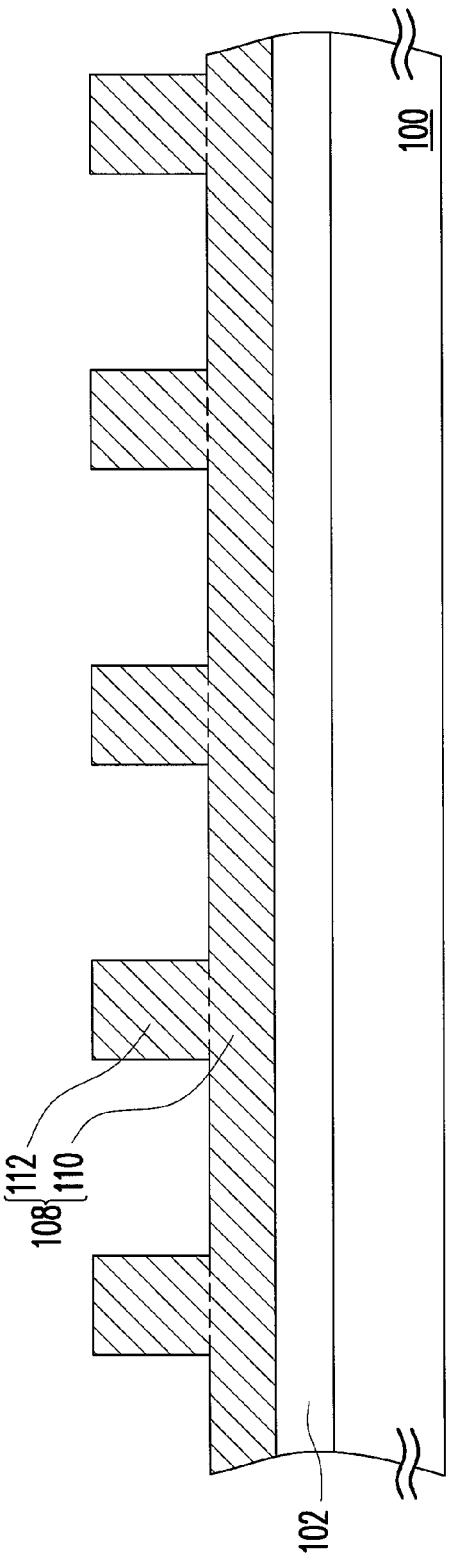
FIG. 1A
FIG. 1B

MEMORY STRUCTURE

BACKGROUND OF THE INVENTION

1. Field of Invention

The present invention relates to a memory structure and a fabricating method thereof, and more generally to a memory structure having a vertical channel and a fabricating method thereof.

2. Description of Related Art

A memory is a semiconductor device designed for storing information or data. As the functions of computer microprocessors become more and more powerful, programs and operations executed by software are increasing correspondingly. Consequently, the demand for high storage capacity memories is getting more. Among various types of memory products, a non-volatile memory such as an electrically erasable programmable read only memory (EEPROM) allows multiple-time data programming, reading and erasing operations, and the data stored therein can be retained even after the power of the memory is interrupted. With these advantages, EEPROM has become one of the most widely adopted memories for personal computers and electronic equipment.

In a typical EEPROM, a floating gate and a control gate are made of doped polysilicon. When the memory is programmed, the electrons injected into the floating gate uniformly distributes in the polysilicon floating gate. However, when defects exist in the tunnel oxide layer under the polysilicon floating gate, a leakage current is easily generated in the device, and the reliability of the device is decreased.

In order to solve the leakage problem of the EEPROM, one known method is to adopt a charge trapping layer including a non-conductive material instead of the polysilicon floating gate. Another advantage obtained from replacing the polysilicon floating gate with the charge trapping layer is that the electrons are only stored in a portion of the charge trapping layer adjacent to the source region or drain region while the device is programmed. Therefore, during the programming process, the voltages can be applied to the source region and the control gate respectively. Hence, the electrons are stored in a portion of the charge trapping layer near the source region with a form of Gaussian distribution. Alternatively, the voltages can be applied to the drain region and the control gate respectively. Hence, the electrons are stored in a portion of the charge trapping layer near the drain region with a form of Gaussian distribution. In the other words, there are two storage regions in the charge trapping layer. Consequently, by changing the voltage applied in the control gate and the source/drain regions at the two sides thereof, two groups of electrons with Gaussian distribution, one group of electrons with Gaussian distribution, or no electrons can be present in a single charge trapping layer. Accordingly, the flash memory replacing the floating gate with the charge trapping layer can be written into a single memory cell in four states and is a flash memory with a 2 bits/cell storage.

However, the dimension of a non-volatile memory is scaled down as the degree of integration of a semiconductor device is increased. When the channel length is shortened, a punch through leakage current easily occurs between the source and drain regions, thereby lowering the performance of the memory device. In addition, as the source and drain regions are scaled down, the secondary hot electrons produced from the programming of the selected memory can not be blocked by the source and drain regions, and thus, the secondary hot electrons would inject into the adjacent memory cells. As a result, program disturbance is generated, and the reliability of the memory device is reduced.

SUMMARY OF THE INVENTION

Accordingly, an embodiment of the present invention provides a memory structure to suppress the generation of a punch through leakage current.

Another embodiment of the present invention provides a fabricating method of a memory structure. The formed memory structure can prevent program disturbance caused by the second hot electrons.

An embodiment of the present invention provides a memory structure including a memory cell, and the memory cell includes a first dielectric layer, a gate, a semiconductor layer, a first doped region, a second doped region and a charge storage layer. The first dielectric layer is disposed on a substrate. The gate includes a base portion and a protruding portion. The base portion is disposed on the first dielectric layer. The protruding portion is disposed on the base portion and exposes a portion of the base portion. The semiconductor layer is conformally disposed on the gate and includes a top portion, a bottom portion and a side portion. The top portion is disposed over the protruding portion. The bottom portion is disposed over the base portion exposed by the protruding portion. The side portion is disposed at a sidewall of the protruding portion and connects the top portion and the bottom portion. The first doped region and the second doped region are respectively disposed in the top portion and the bottom portion, wherein the side portion serves as a channel region. The charge storage layer is disposed between the gate and the semiconductor layer.

According to an embodiment of the present invention, the material of the first dielectric layer includes silicon oxide.

According to an embodiment of the present invention, the material of the gate includes doped polysilicon.

According to an embodiment of the present invention, the material of the semiconductor layer includes polysilicon.

According to an embodiment of the present invention, the charge storage layer includes a second dielectric layer, a third dielectric layer and a charge trapping layer. The second dielectric layer is disposed on the gate. The third dielectric layer is disposed on the second dielectric layer. The charge trapping layer is disposed between the second dielectric layer and the third dielectric layer.

According to an embodiment of the present invention, the material of each of the second dielectric layer and the third dielectric layer includes silicon oxide.

According to an embodiment of the present invention, the material of the charge trapping layer includes a high-K material or a nano-crystal material.

According to an embodiment of the present invention, when the memory structure includes a plurality of memory cells, adjacent gates on the same word line are connected to each other through the base portion.

According to an embodiment of the present invention, when the memory structure includes a plurality of memory cells, two adjacent side portions located between two adjacent protruding portions are disposed separately from each other.

According to an embodiment of the present invention, the memory structure further includes a plurality of contacts respectively connected to the first doped region and the second doped region.

Another embodiment of the present invention provides a fabricating method of a memory structure including the following steps. A first dielectric layer is formed on a substrate. A word line is formed on the first dielectric layer, and the word line includes a base portion and a plurality of protruding portions. The base portion is disposed on the first dielectric layer. The protruding portions are disposed on the base portion and expose a portion of the base portion. A charge storage layer is conformally formed on the word line. A semiconductor layer is conformally formed on the charge storage layer, and the semiconductor layer includes a plurality of top portions, a plurality of bottom portions and a plurality of side portions. The top portions are respectively disposed over the protruding portions. The bottom portions are respectively disposed over the base portion exposed by the protruding portions. The side portions are respectively disposed at sidewalls of the protruding portions and connect the top portions and the bottom portions, wherein two adjacent side portions located between two adjacent protruding portions are disposed separately from each other. A first doped region is formed in each top portion and a second doped region is formed in each bottom portion, wherein each side portion serves as a channel region.

According to another embodiment of the present invention, the method of forming the first dielectric layer includes performing a chemical vapour deposition (CVD) process.

According to another embodiment of the present invention, the method of forming the word line includes forming a word line material layer on the first dielectric layer; and removing a portion of the word line material layer.

According to another embodiment of the present invention, the method of forming the charge storage layer includes forming a second dielectric layer on the word line; forming a charge trapping layer on the second dielectric layer; and forming a third dielectric layer on the charge trapping layer.

According to another embodiment of the present invention, the method of forming the semiconductor layer includes forming an amorphous silicon layer with an amorphous silicon process; and performing a solid phase crystallization (SPC) process to the amorphous silicon layer.

According to another embodiment of the present invention, the method of forming the semiconductor process includes performing a CVD process.

According to another embodiment of the present invention, the method of forming the first doped regions and the second doped regions includes performing an ion implantation process.

According to another embodiment of the present invention, the ion implantation process includes a vertical ion implantation process.

According to another embodiment of the present invention, each protruding portion and the base portion form a gate.

According to another embodiment of the present invention, the fabricating method further includes forming a plurality of contacts respectively connected to the first doped regions and the second doped regions.

In view of the above, in the memory structure of an embodiment of the present invention, a channel region is vertical and has a longer channel length, so that the punch through phenomenon can be effectively suppressed, and a punch through leakage current can be further avoided.

Besides, in the fabricating method of the memory structure of an embodiment of the present invention, two adjacent side portions located between two adjacent protruding portions are disposed separately from each other. Accordingly, the secondary hot electrons produced from the programming of the selected memory can be prevented from injecting into the adjacent memory cells, so as to avoid program disturbance caused by the second hot electrons.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1E schematically illustrate cross-sectional views of a fabricating method of a memory structure according to an embodiment of the present invention.

DESCRIPTION OF EMBODIMENTS

Figure 1C:
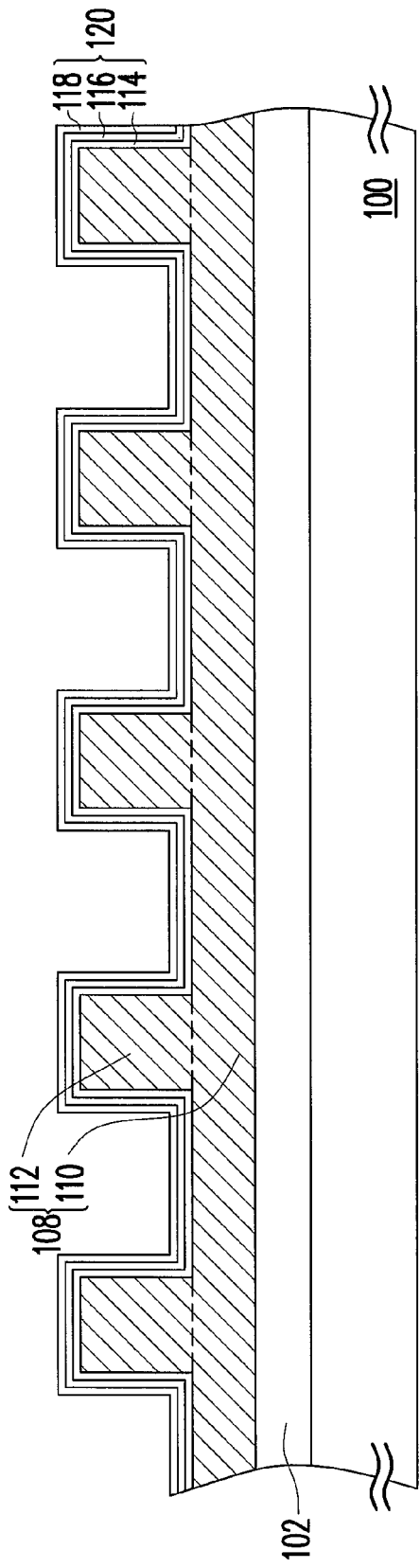

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E schematically illustrate cross-sectional views of a fabricating method of a memory structure according to an embodiment of the present invention.

Referring to FIG. 1A, a dielectric layer 102 is formed on a substrate 100. The dielectric layer 102 serves as a buffer dielectric layer for separating the substrate 100 from the subsequently formed word line on the substrate 100. The material of the dielectric layer 102 is silicon oxide, for example. The method of forming the dielectric layer 102 includes performing a chemical vapour deposition (CVD) process.

Thereafter, a word line material layer 104 is formed on the dielectric layer 102. The word line material layer 104 includes a conductive material, such as doped polysilicon. The method of forming the word line material layer 104 includes performing a CVD process.

Afterwards, a patterned photoresist layer 106 is formed on the word line material layer 104. The method of forming the patterned photoresist layer 106 includes performing a photolithography process.

Referring to FIG. 1B, a portion of the word line material layer 104 is removed by using the patterned photoresist layer 106 as a mask, so as to form a word line 108 on the dielectric layer 102. The word line 108 includes a base portion 110 and a plurality of protruding portions 112. The base portion 110 is disposed on the dielectric layer 102. The protruding portions 112 are disposed on the base portion 110 and expose a portion of the base portion 110. The method of removing the portion of the word line material layer 104 includes performing a dry etching process. In addition, the word line 108 is, for example, formed by the said method, but the present invention is not limited thereto.

The patterned photoresist layer 106 is then removed. The patterned photoresist layer 106 is removed by a dry photoresist removing method, for example.

Referring to FIG. 1C, a dielectric layer 114 is formed on the word line 108. The material of the dielectric layer 114 is silicon oxide, for example. The method of forming the dielectric layer 114 includes performing a CVD process.

Thereafter, a charge trapping layer 116 is formed on the dielectric layer 114. The material of the charge trapping layer 116 includes a high-K material or a nano-crystal material. The high-K material is silicon nitride, for example. The nano-crystal material includes nano-crystals of silicon, germanium or other metal. The method of forming the charge trapping layer 116 includes performing a CVD process.

Afterwards, a dielectric layer 118 is formed on the charge trapping layer 116. The material of the dielectric layer 118 is silicon oxide, for example. The method of forming the dielectric layer 118 includes performing a CVD process.

In such manner, a charge storage layer 120 including the dielectric layer 114, the charge trapping layer 116 and the dielectric layer 118 is conformally formed on the word line 108. In addition, the charge storage layer 120 is, for example, formed by the said method, but the present invention is not limited thereto.

Figure 1D:
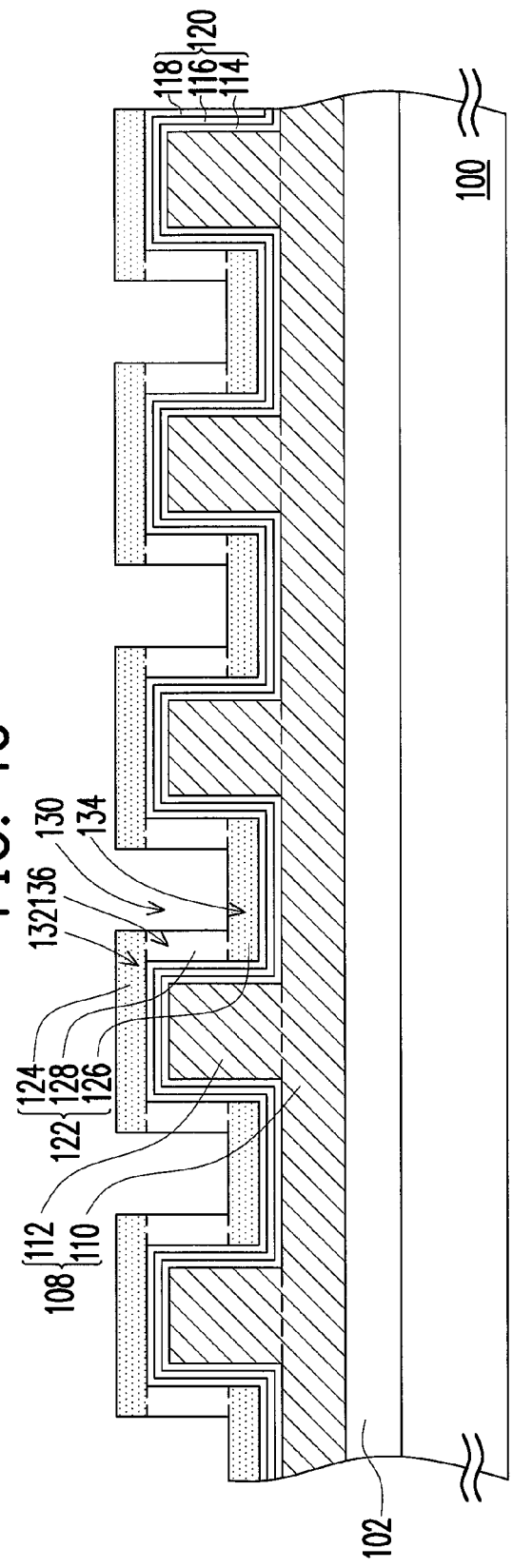

Referring to FIG. 1D, a semiconductor layer 122 is conformally formed on the charge storage layer 120, and the semiconductor layer 122 includes a plurality of top portions 124, a plurality of bottom portions 126 and a plurality of side portions 128. The top portions 124 are respectively disposed over the protruding portions 112. The bottom portions 126 are respectively disposed over the base portion 110 exposed by the protruding portions 112. The side portions 128 are respectively disposed at sidewalls of the protruding portions 112 and connect the top portions 124 and the bottom portions 126. The charge storage layer 120 and the semiconductor layer 122 are sequentially and conformally formed over the word line 108 having the protruding portions 112, so that the semiconductor layer 122 can have recesses 130 between two adjacent side portions 128 between two adjacent protruding portions 122, and thus, two adjacent side portions 128 located between two adjacent protruding portions 122 are disposed separately from each other.

Further, the material of the semiconductor layer 122 is polysilicon, for example. The method of forming the semiconductor layer 122 includes forming an amorphous silicon layer with an amorphous silicon process, and then performing a solid phase crystallization (SPC) process to the amorphous silicon layer. In another embodiment, the method of forming the semiconductor layer 122 includes performing a CVD process.

Next, a doped region 132 is formed in each top portion 124 and a doped region 134 is formed in each bottom portion 126, wherein each side portion 128 serves as a channel region 136. The method of forming the doped regions 132 and 134 includes performing an ion implantation process, such as a vertical ion implantation process. Generally speaking, the doped regions 134 formed by the ion implantation process are formed in the bottom portions 126 exposed by the recesses 130. However, the doped regions 134 can further diffuse into the bottom portions 126 below the side portions 128 by performing an additional thermal process or by a thermal process in the subsequent process.

Figure 1E:
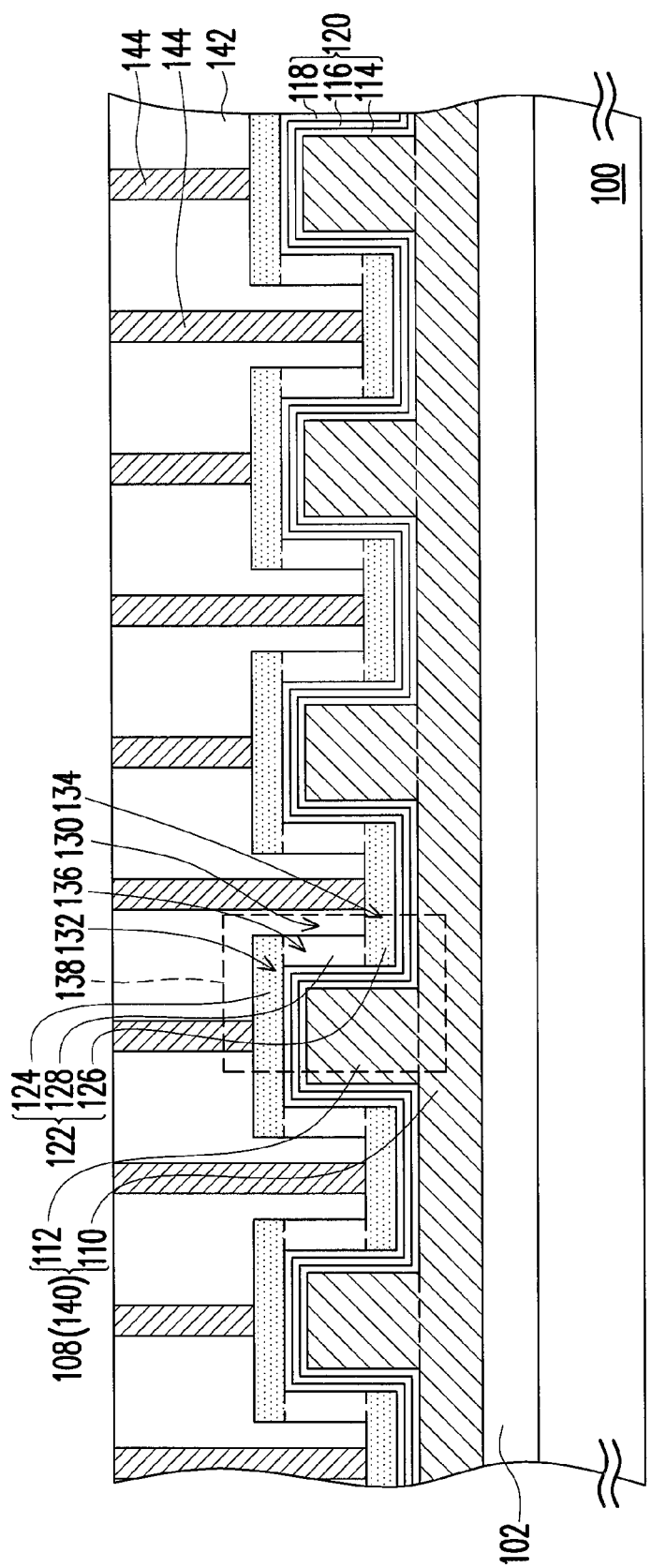

Referring to FIG. 1E, a dielectric layer 142 is formed on the semiconductor layer 122. The material of the dielectric layer 142 is silicon oxide, for example. The method of forming the dielectric layer 142 includes performing a CVD process.

Thereafter, contacts 144 are formed in the dielectric layer 142, and the contacts 144 are connected to the doped regions 132 and the doped regions 134 respectively. The material of the contacts 144 is conductive material, such as tungsten. The method of forming the contacts 144 includes forming a plurality of openings in the dielectric layer 142, forming a conductive material layer to fill up the openings, and then removing the conductive material layer outside the openings.

In view of the said embodiment, each channel region 136 formed from the corresponding side portion 128 is a vertical channel region, so that the channel regions 136 can be designed to have a longer channel length. Therefore, the punch through phenomenon can be effectively suppressed, and a punch through leakage current can be further avoided.

Besides, two adjacent side portions 128 located between two adjacent protruding portions 122 are disposed separately from each other, and thus, the secondary hot electrons produced from the programming of the selected memory can be prevented from injecting into the adjacent memory cells, so as to avoid program disturbance caused by the second hot electrons and further enhance the reliability of the memory device.

In the following, the memory structure of an embodiment of the present invention is illustrated with FIG. 1E.

The memory structure includes a plurality of memory cells 138, and each memory cell includes a dielectric layer 102, a gate 140, a semiconductor layer 122, a doped region 132, a doped region 134 and a charge storage layer 120. The dielectric layer 102 is disposed on a substrate 100. The gate 140 is a portion of the word line 108 and includes a base portion 110 and a protruding portion 112. The base portion 110 is disposed on the dielectric layer 102. Besides, the adjacent gates 140 on the same word line 108 are connected to each other through the base portion 110. The protruding portion 112 is disposed on the base portion 110 and exposes a portion of the base portion 110. The semiconductor layer 122 is conformally disposed on the gate 140 and includes a top portion 124, a bottom portion 126 and a side portion 128. The top portion 124 is disposed over the protruding portion 112. The bottom portion 126 is disposed over the base portion 110 exposed by the protruding portion 112. The side portion 128 is disposed at a sidewall of the protruding portion 112 and connects the top portion 124 and the bottom portion 126. The doped region 132 and the doped region 134 are respectively disposed in the top portion 124 and the bottom portion 126. The doped region 132 and the doped region 134 can respectively serve as a source region and a drain region (i.e. bit line). The side portion 128 serves as a channel region. The charge storage layer 120 is disposed between the gate 140 and the semiconductor layer 122. The charge storage layer 120 includes a dielectric layer 114, a dielectric layer 118 and a charge trapping layer 116. The dielectric layer 114 is disposed on the gate 140. The dielectric layer 118 is disposed on the dielectric layer 114. The charge trapping layer 116 is disposed between the dielectric layer 114 and the dielectric layer 118. When the memory structure includes a plurality of memory cells 138, two adjacent side portions 128 located between two adjacent protruding portions 112 are disposed separately from each other. The memory structure can further optionally include at least one of the dielectric layer 142 and the contacts 144. The contacts 144 are disposed in the dielectric layer 142 and respectively connected to the doped region 132 and the doped region 134. Moreover, the materials, forming methods and functions of the components of the memory structure have been described in the said embodiment, so that the details are not iterated herein.

In summary, the said embodiment at least has the following advantages:

The memory structure of the said embodiment can suppress the generation of a punch through leakage current.

The memory structure fabricated by the method of the said embodiment can prevent program disturbance caused by the second hot electrons.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A memory structure, comprising a memory cell comprising:
   a first dielectric layer, disposed on a substrate;
   a control gate, comprising:

a base portion, disposed on the first dielectric layer; and
a protruding portion, disposed on the base portion and exposing a portion of the base portion;
a semiconductor layer, conformally disposed on the control gate and comprising:
a top portion, disposed over the protruding portion;
a bottom portion, disposed over the base portion exposed by the protruding portion; and
a side portion, disposed at a sidewall of the protruding portion and connecting the top portion and the bottom portion;
a first doped region and a second doped region, respectively disposed in the top portion and the bottom portion, wherein the side portion serves as a channel region; and
a charge storage layer, disposed between the control gate and the semiconductor layer.

2. The memory structure of claim 1, wherein a material of the first dielectric layer comprises silicon oxide.

3. The memory structure of claim 1, wherein a material of the control gate comprises doped polysilicon.

4. The memory structure of claim 1, wherein a material of the semiconductor layer comprises polysilicon.

5. The memory structure of claim 1, wherein the charge storage layer comprises:

a second dielectric layer, disposed on the control gate;
a third dielectric layer, disposed on the second dielectric layer; and
a charge trapping layer, disposed between the second dielectric layer and the third dielectric layer.

6. The memory structure of claim 5, wherein a material of each of the second dielectric layer and the third dielectric layer comprises silicon oxide.

7. The memory structure of claim 5, wherein a material of the charge trapping layer comprises a high-K material or a nano-crystal material.

8. The memory structure of claim 1, wherein when the memory structure comprises a plurality of memory cells, adjacent control gates on the same word line are connected to each other through the base portion.

9. The memory structure of claim 1, wherein when the memory structure comprises a plurality of memory cells, two adjacent side portions located between two adjacent protruding portions are disposed separately from each other.

10. The memory structure of claim 1, further comprising a plurality of contacts respectively connected to the first doped region and the second doped region.

* * * * *